(12) United States Patent
Urano

(10) Patent No.: US 7,180,005 B2
(45) Date of Patent: Feb. 20, 2007

(54) PRINTED WIRING BOARD

(75) Inventor: Wataru Urano, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/514,657

(22) PCT Filed: May 19, 2003

(86) PCT No.: PCT/JP03/06192

§ 371 (c)(1),
(2), (4) Date: Nov. 16, 2004

(87) PCT Pub. No.: WO03/098983

PCT Pub. Date: Nov. 27, 2003

(65) Prior Publication Data

US 2005/0167154 A1    Aug. 4, 2005

(30) Foreign Application Priority Data

May 17, 2002    (JP) .............................. 2002-143530

(51) Int. Cl.
*H05K 1/03* (2006.01)
(52) U.S. Cl. ....................... 174/255; 174/261
(58) Field of Classification Search ................ 174/254, 174/255, 260, 261
See application file for complete search history.

(56) References Cited

U.S. PATENT DOCUMENTS

| | | | | |
|---|---|---|---|---|
| 4,064,357 A | * | 12/1977 | Dixon et al. ................. | 174/262 |
| 4,859,808 A | * | 8/1989 | Jeter et al. ................... | 174/261 |
| 5,517,756 A | * | 5/1996 | Shirai et al. .................. | 29/847 |
| 5,523,920 A | * | 6/1996 | Machuga et al. ........... | 361/767 |
| 6,774,474 B1 | * | 8/2004 | Caletka et al. .............. | 257/686 |

FOREIGN PATENT DOCUMENTS

| JP | S64-53493 A | 3/1989 |
|---|---|---|
| JP | H04-101496 A | 4/1992 |
| JP | H04-263491 A | 8/1992 |
| JP | S58-49637 Y2 | 11/1993 |
| JP | H08-340170 A | 12/1996 |

* cited by examiner

*Primary Examiner*—Ishwar (I. B.) Patel
(74) *Attorney, Agent, or Firm*—Sughrue Mion, PLLC

(57) ABSTRACT

The printed wiring board includes a substrate, an electrically conductive pattern formed on the substrate, and an electrical insulator covering the substrate and the electrically conductive pattern therewith, wherein a region of the electrically conductive pattern exposed through an opening formed throughout the electrical insulator is used as the pad, and a region except the pad is used as a circuit wire. The opening has opposite ends extending in a first direction beyond the electrically conductive pattern such that opposite ends of the pad in the first direction are defined by the electrically conductive pattern, and further has opposite ends extending in a second direction perpendicular to the first direction to intersect with the electrically conductive pattern such that the pad is defined in shape in the second direction by the opposite ends of the opening extending in the second direction. The pad is smaller in length in the first direction than the circuit wire.

1 Claim, 5 Drawing Sheets

PRINTED WIRING BOARD

BACKGROUND OF THE INVENTION

1. Field of the Invention

The invention relates to a printed wiring board, and more particularly to a printed wiring board including a circuit wire electrically connected at a distal end thereof to a pad formed on the printed wiring board (hereinafter, simply referred to as "pad").

2. Description of the Related Art

FIG. 7 is a plan view illustrating an example of a conventional printed wiring board.

A plurality of circuit wires 1 is arranged on a substrate in parallel with one another. Each of the circuit wires 1 extends in a certain direction X. Each of the circuit wires 1 has a circuit pad 34 at a distal end. An electrical insulator 3 such as a solder resist or pre-preg covers the substrate and the circuit wires 1 therewith.

The electrical insulator 3 is formed with a plurality of circular openings 32 through each of which the pad 34 is entirely exposed.

Since the pad 34 is entirely exposed through the circular opening 32 in the conventional printed wiring board illustrated in FIG. 7, the electrical insulator 34 does not exist above the pad 34, and hence, the pad 34 is not compressed by the electrical insulator 3. As a result, the pad 34 makes contact with the substrate with insufficient contact force, and hence, the conventional printed wiring board illustrated in FIG. 7 is accompanied with a problem that the pad 34 is likely to peel off at the circular opening 32.

As one of solutions to the problem, the circular opening 32 may be formed smaller than the pad 34. By forming the circular opening 32 smaller than the pad 34, the pad 34 is compressed at its periphery by the electrical insulator 3, resulting in that the pad 34 makes contact with the substrate with sufficient contact force, and hence, it is possible to prevent the pad 34 from peeling off at the circular opening 32.

However, a contact composed of solder or paste containing electrical conductor, formed on the pad 34, makes contact only with a surface of the pad 34, and does not make contact with a sidewall of the pad 34; resulting in another problem of insufficient contact force between the pad 34 and a contact formed on the pad.

Furthermore, since the circular pad 34 is formed at a distal end of the circuit wire 1 in the conventional printed wiring board illustrated in FIG. 7, a pitch between adjacent pads 34 is unavoidably small. An area array type LSI package most often used presently is designed to have a lot of terminals at a small pitch in accordance with a need that electronic devices are mounted at a high density. Thus, when wires are connected to the terminals of such an area-array type LSI package, it would be quite difficult to increase the number of wires extending through a gap between the adjacent pads.

Japanese Utility Model Application No. 63-126428 has suggested a printed wiring board including an electrically insulating substrate, a plurality of pads formed on the substrate, and solder resist thicker than an electrical conductor covering the pads at ends therewith, wherein the pads have a width greater than a width of the solder resist.

Japanese Patent Application Publication No. 8-64939 has suggested a printed wiring board on which a device including a plurality of elongate terminals is to be mounted, including a substrate, a plurality of solder pads arranged on an upper surface the substrate for soldering the terminals therewith, and solder resist formed on the substrate in an area except the solder pads for preventing adhesion of molten solder. The substrate is formed on a lower surface with a region in which solder resist is not formed for absorbing extra molten solder.

Japanese Patent Application Publication No. 8-107264 has suggested a printed wiring board including a substrate, a terminal formed on the substrate, and an electrically insulating layer covering the terminal therewith. The electrically insulating layer is formed with an opening through which a principal surface area of the substrate except an edge of the terminal is exposed, and is thicker than the terminal.

Japanese Patent Application Publication No. 9-27661 has suggested a printed wiring board on which a plurality of electrodes is arranged at a predetermined pitch. Each of the electrodes is comprised of a main body having a certain shape, and an extended portion wider than the main body in a first direction in which the electrodes are arranged. The extended portions of the electrodes disposed adjacent to each other are spaced away from each other in a second direction perpendicular to the first direction.

Japanese Patent Application Publication No. 2000-77471 has suggested a substrate on which an electrically conductive pattern on which a bump of an electronic device is mounted in flip-chip is formed. The electrically conductive pattern is comprised of a wire pattern which will make a wire, and a pad formed integrally with the wire pattern at a location at which the bump is mounted. The electrically conductive pattern has a width W2 greater than a width W1 of the pad.

SUMMARY OF THE INVENTION

In view of the above-mentioned problems in the conventional printed wiring board, it is an object of the present invention to provide a printed wiring board having a pad structure which is capable of providing sufficient contact force between a pad and a substrate and sufficient contact force between a pad and a contact.

It is another object of the present invention to provide a printed wiring board having a pad structure making it possible to arrange pads at an extended pitch.

Hereinbelow is described the printed wiring board in accordance with the present invention through the use of reference numerals used in later described embodiments. The reference numerals are indicated only for the purpose of clearly showing correspondence between claims and the embodiments. It should be noted that the reference numerals are not allowed to interpret of claims of the present application.

The present invention provides a printed wiring board including a substrate (12), an electrically conductive pattern formed on the substrate (12), and an electrical insulator (3) covering the substrate (12) and the electrically conductive pattern therewith, wherein a region of the electrically conductive pattern exposed through an opening (2) formed throughout the electrical insulator (3) is used as a pad (4), and a region except the pad (4) is used as a circuit wire (1), the opening (2) is formed so as to separately expose the electrically conductive pattern, the opening (2) has opposite ends (22) extending in a first (Y) direction beyond the electrically conductive pattern such that opposite ends of the pad (4) in the first (Y) direction are defined by the electrically conductive pattern, the opening (2) further has opposite ends (21) extending in a second (X) direction perpendicular to the first (Y) direction to intersect with the electrically conductive pattern such that the pad (4) is defined in shape in the second (X) direction by the opposite ends (21) of the opening (2) extending in the second (X) direction, and the pad (4) is smaller in length in the first (Y) direction than the circuit wire (1).

The present invention further provides a printed wiring board including a substrate (12), an electrically conductive pattern formed on the substrate (12), and an electrical insulator (3) covering the substrate (12) and the electrically conductive pattern therewith, wherein a region of the electrically conductive pattern exposed through an opening (2) formed throughout the electrical insulator (3) is used as a pad (4), and a region except the pad (4) is used as a circuit wire (1), the opening (2) is formed so as to separately expose the electrically conductive pattern, the opening (2) has opposite ends (22) extending in a first (Y) direction beyond the electrically conductive pattern such that opposite ends of the pad (4) in the first direction are defined by the electrically conductive pattern, the opening (2) further has opposite ends (21) extending in a second (X) direction perpendicular to the first (Y) direction to intersect with the electrically conductive pattern such that the pad (4) is defined in shape in the second (X) direction by the opposite ends (21) of the opening (2) extending in the second (X) direction, and the pad (4) is smaller in length in the first (Y) direction than the circuit wire (1), the pad (4) is comprised of a plurality of pads (4C) arranged in the second (X) direction, the circuit wire (1) is comprised of a plurality of circuit wires spaced away from one another in the first (Y) direction and extending in the second (X) direction, and at least one of the circuit wires (1) is bending by having a component directed toward the first (Y) direction, and is electrically connected to the pad (4) at a side (4a) thereof extending in the second (X) direction.

The pad (4) may be comprised of a plurality of pads (4C) arranged in the second direction as well as in the first direction, in which case, the circuit wire (1) is arranged for each of pad rows arranged in the second direction.

It is preferable that the electrically conductive pattern has opposite ends (6) in the second direction, the opening (2) is spaced away from the opposite ends (6) of the electrically conductive pattern, and the circuit wire (1) is electrically connected to the pad (4) at a side (4a) thereof extending in the second direction.

The advantages obtained by the aforementioned present invention will be described hereinbelow.

The first advantage provided by the present invention is that a pad can be made smaller, and it is possible to prevent reduction in a contact force between a pad and a substrate and a contact force between a pad and an electrical conductor.

This is because a pad can have a region in which the pad is covered with an electrical insulator and a region in which the pad is not covered with an electrical insulator.

The second advantage provided by the present invention is that a printed wiring board on which area-array LSI packages are to be mounted can be fabricated in low costs in a conventional process.

This is because that the printed wiring board in accordance with the present invention makes it possible to increase a gap formed between adjacent pads, ensuring that the number of circuit wires to be extended through the gap can be increased, and thus, circuit wires extending from terminals of an area-array LSI package can be arranged on a surface of the printed wiring board.

Thus, it would be possible to reduce the number of layers of the printed wiring board, preventing an increase in costs for fabrication of the printed wiring board.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
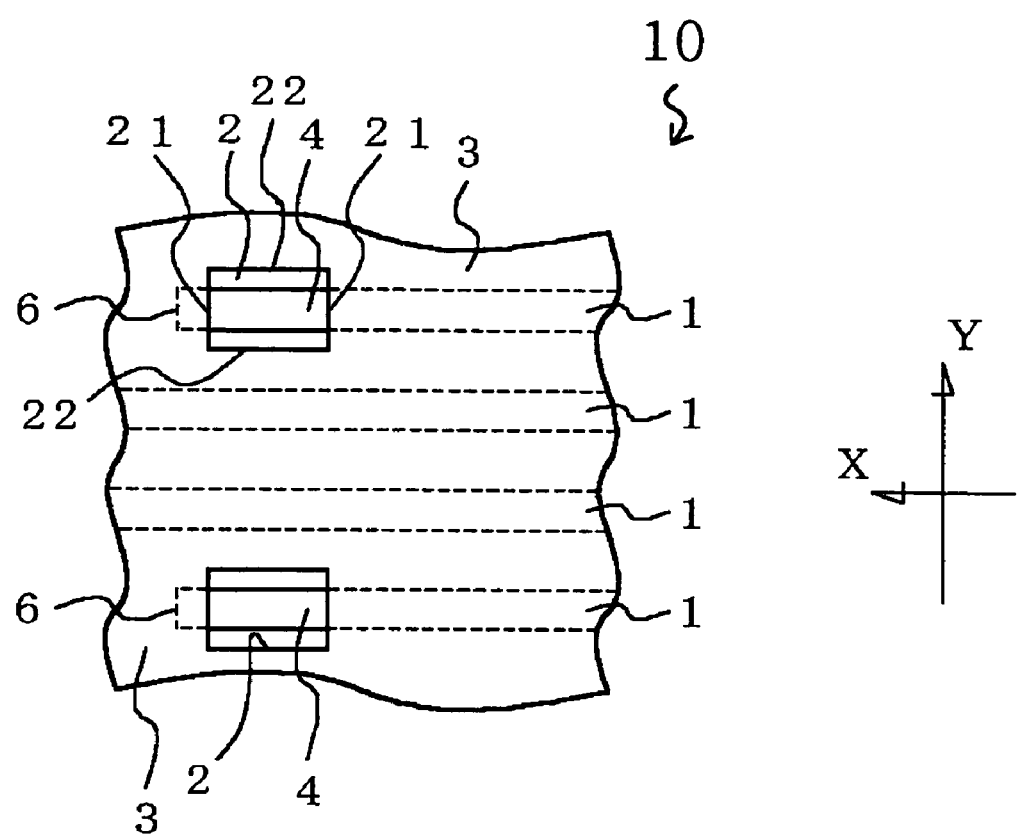
FIG. 1 is a partial plan view of the printed wiring board in accordance with the first embodiment of the present invention.

FIG. 1 is a partial plan view of a printed wiring board 10 in accordance with the first embodiment of the present invention. FIG. 2(a) is an enlarged plan view of the printed wiring board 10, FIG. 2(b) is a cross-sectional view taken along the line B—B in FIG. 2(a), and FIG. 2(c) is a cross-sectional view taken along the line C—C in FIG. 2(a).

The printed wiring board 10 in accordance with the first embodiment is comprised of a substrate 12 (see FIG. 2(b)), four circuit wires 1 formed on the substrate 12, and electrical insulator 3 covering the substrate 12 and the circuit wires 1 therewith.

The four circuit wires 1 extend in X direction (second direction) in parallel with one another, and are spaced away from one another in Y direction (first direction) perpendicular to the X direction. Each of the circuit wires 1 is formed as an electrically conductive pattern formed by patterning electrically conductive material deposited on the substrate 12.

The electrical insulator 3 is formed with a plurality of rectangular openings 2. A part of the circuit wire 1 exposed through the opening 2 is used as a pad 4. That is, among the four circuit wires 1 in the printed wiring board 10 in accordance with the first embodiment, each of the electrical conductive patterns located uppermost and lowermost is comprised of the circuit wire 1 extending in the X direction and the pad 4 electrically connected to the circuit wire 1, and each of the intermediate two electrically conductive patterns is comprised of the circuit wire 1 extending in the X direction.

The pad 4 is in the form of a rectangle having the same width (length in the Y direction) as that of the circuit wire 1. Since the pad 4 is not circular unlike the pad 34 in the conventional printed wiring board illustrated in FIG. 7, it is possible to arrange the pads 4 disposed adjacent in the Y direction, at a greater pitch. Thus, two circuit wires 1 can be arranged between the uppermost and lowermost circuit wires.

Opposite ends 22 of the opening 2 in the Y direction extend outwardly beyond the circuit wire 1. Hence, sidewalls of the pad 4 in the Y direction are exposed. Thus, electrical conductor to be deposited on the pad 4 covers not only a surface of the pad 4, but also sidewalls of the pad 4 therewith, ensuring enhancement in contact force between the pad 4 and the electrical conductor.

In contrast, opposite ends 21 of the opening 2 in the X direction extend across the circuit wire 1. Hence, the pad 4 is compressed by the electrical insulator 3 at the opposite ends 21. As a result, the pad 4 makes contact with the substrate 12 with increased contact force, ensuring that the pad 4 is hardly peeled off the substrate 12.

Hereinbelow is explained the increased contact force between the pad 4 and, the substrate 12, with reference to FIG. 2.

Figure 2:
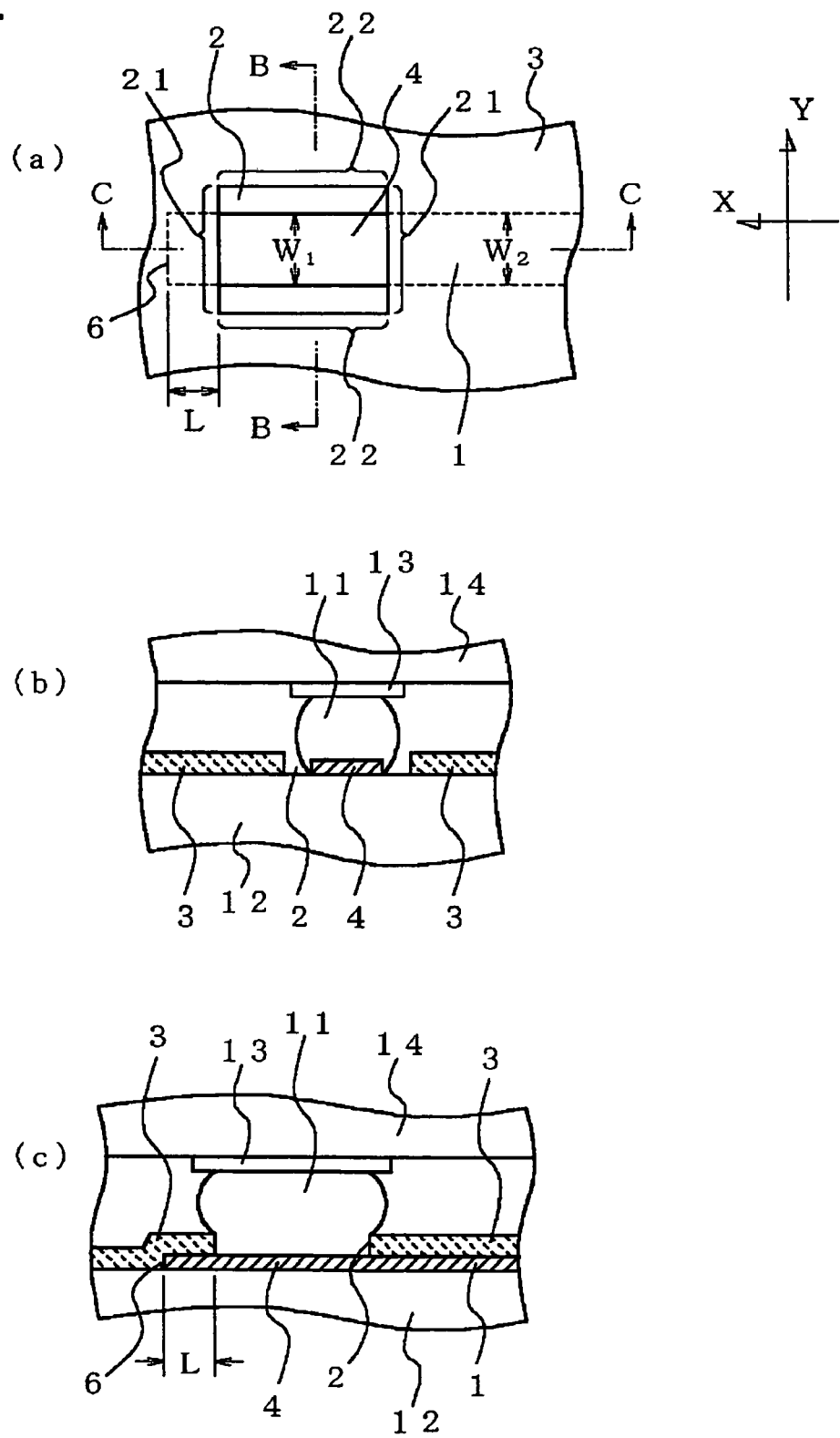
FIG. 2(a) is an enlarged plan view of the printed wiring board in accordance with the first embodiment of the present invention.
FIG. 2(b) is a cross-sectional view taken along the line B—B in FIG. 2(a)
FIG. 2(c) is a cross-sectional view taken along the line C—C in FIG. 2(a).

As illustrated in FIG. 2(*a*), the circuit wire 1 comprised of an electrically conductive pattern is formed on the substrate 12. The pad 4 defined by the opening 2 formed with the electrical insulator 3 is formed continuously with the circuit wire 1. As illustrated in FIG. 2(*b*), a connection bump electrode as an electrical conductor 11 is formed on the pad 4. The pad 4 is electrically connected to a LSI package pad 13 formed on a lower surface of a LSI package 14, through the electrical conductor 11.

As mentioned above, since the opposite ends 22 of the opening 2 in the Y direction are spaced away from the pad 4, the electrical conductor 11 spreads over the pad 4 in wet condition, and further spreads to sidewalls of the pad 4, as illustrated in FIG. 2(*b*). Thus, the electrical conductor 11 surrounds the pad 4, preventing reduction in a contact force between the pad 4 and the electrical conductor 11.

On the other hand, the pad 4 is covered with the electrical insulator 3 at the opposite ends 21 of the opening 2 in the X direction, as illustrated in FIG. 2(*c*). Thus, the pad 4 is compressed by the electrical insulator 3. As a result, a force for preventing the pad 4 from peeling off the substrate 12 acts on the pad 4, preventing reduction in a contact force between the pad 4 and the substrate 12.

In the first embodiment, since a length W1 of the pad 4 in the Y direction is equal to a length W2 of the circuit wire in the Y direction, it is possible to fabricate the pad 4 extending from the electrically conductive pattern having the same width and electrically connected to the circuit wire 1.

The printed wiring board 10 in accordance with the first embodiment is designed to include four circuit wires 1. However, the number of the circuit wires 1 is not to be limited to four. Any integer equal to or greater than one may be selected.

Furthermore, a shape of the opening 2 of the electrical insulator 3 is not to be limited to a rectangle. The opening may be in the form of any quadrangle such as a parallelogram or a rhombus.

[Second Embodiment]

Figure 3:
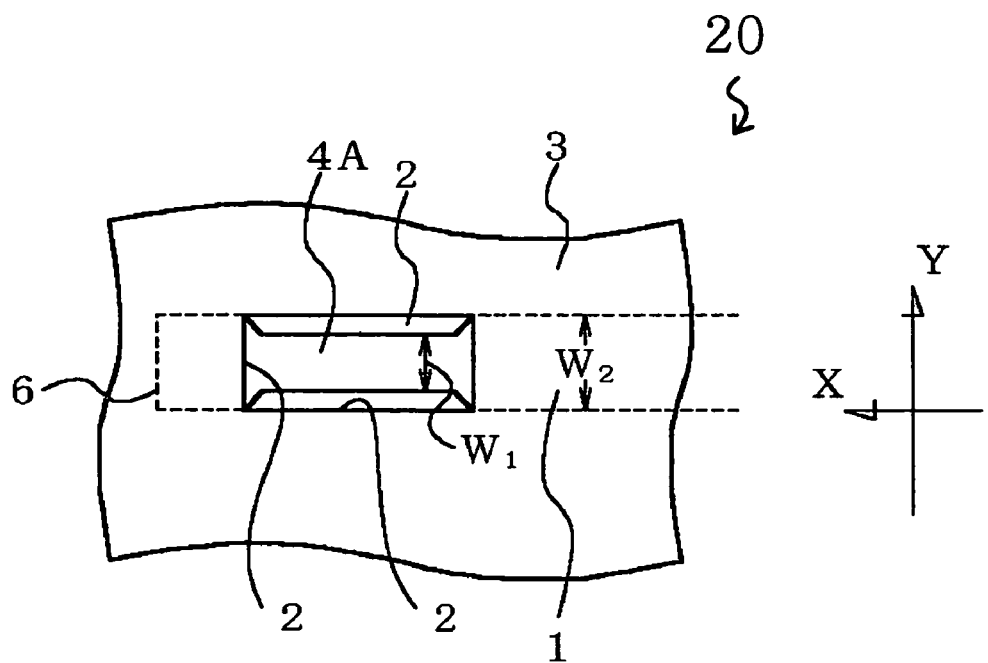
FIG. 3 is a partial plan view of the printed wiring board in accordance with the second embodiment of the present invention.

FIG. 3 is a partial plan view of a printed wiring board 20 in accordance with the second embodiment of the present invention. Parts or elements in FIG. 3 that correspond to those illustrated in FIGS. 1 or 2 have been provided with the same reference numerals, and are not explained.

The printed wiring board 20 in accordance with the second embodiment is different from the printed wiring board 10 in accordance with the first embodiment in a shape of a pad. That is, in the second embodiment, a width (a length in the Y direction) of the opening 2 of the electrical insulator 3 is designed equal to a width of the circuit wire 1, and a width of the pad is designed smaller than a width of the opening 2 of the electrical insulator 3 in order to narrow a distance between adjacent circuit wires 1.

Specifically, as illustrated in FIG. 3, a length W1 of a pad 4A in the Y direction is designed smaller than a length W2 of the circuit wire 1 in the Y direction.

The second embodiment is useful in a case that the pad 4A can make contact with the electrical insulator 11 in a sufficiently large contact area, but it is necessary to make further spatial margin between adjacent circuit wires relative to expansion of the electrical conductor 11 in the Y direction (see FIG. 2(*b*)).

[Third Embodiment]

Figure 4:
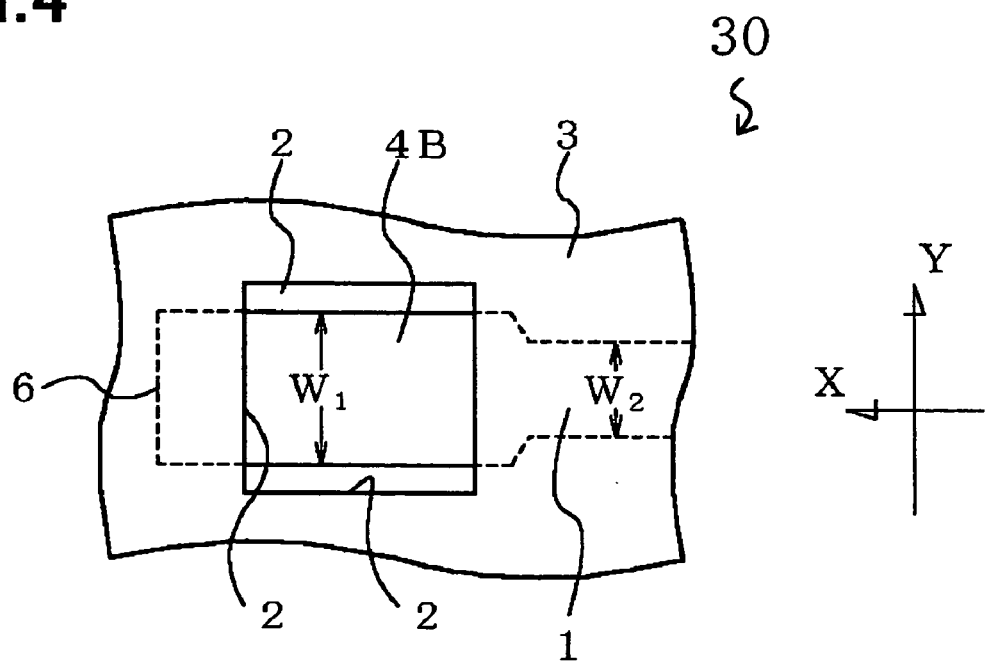
FIG. 4 is a partial plan view of the printed wiring board in accordance with the third embodiment of the present invention.

FIG. 4 is a partial plan view of a printed wiring board 30 in accordance with the third embodiment of the present invention. Parts or elements in FIG. 4 that correspond to those illustrated in FIG. 1 or 2 have been provided with the same reference numerals, and are not explained.

The printed wiring board 30 in accordance with the third embodiment is different from the printed wiring board 10 in accordance with the first embodiment in a shape of a pad.

Specifically, as illustrated in FIG. 4, a length W1 of a pad 4B in the Y direction is designed greater than a length W2 of the circuit wire 1 in the Y direction.

The third embodiment is useful in a case that there is sufficient spatial margin between adjacent circuit wires, but it is necessary to increase a contact area through which the pad 4B makes contact with the electrical insulator 11.

[Fourth Embodiment]

Figure 5:
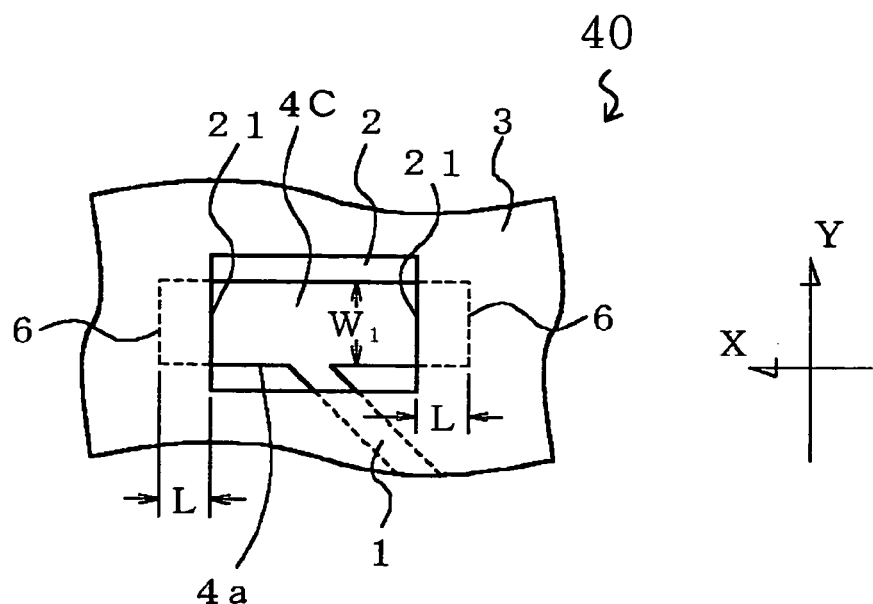
FIG. 5 is a partial plan view of the printed wiring board in accordance with the fourth embodiment of the present invention.

FIG. 5 is a partial plan view of a printed wiring board 40 in accordance with the fourth embodiment of the present invention. Parts or elements in FIG. 5 that correspond to those illustrated in FIG. 1 or 2 have been provided with the same reference numerals, and are not explained.

The printed wiring board 40 in accordance with the fourth embodiment is different from the printed wiring board 10 in accordance with the first embodiment in a direction in which the circuit wire 1 is connected to the pad 4.

In the printed wiring board 10 in accordance with the first embodiment, the; circuit wire 1 and the pad 4 are arranged in a common line. In contrast, in the fourth embodiment, the circuit wire 1 is connected to a pad 4C at a sidewall 4*a* of the pad 4C extending in the X direction, as illustrated in FIG. 5.

The fourth embodiment is useful in a case that it is necessary to direct the circuit wire 1 and the pad 4C differently from each other.

A relation between a length L from a distal end 6 of the circuit wire 1 to an end 21 of the opening 2 in the X direction and a length W1 of the pad 4C in the:Y direction is identical with the same in the first embodiment.

[Fifth Embodiment]

Figure 6:
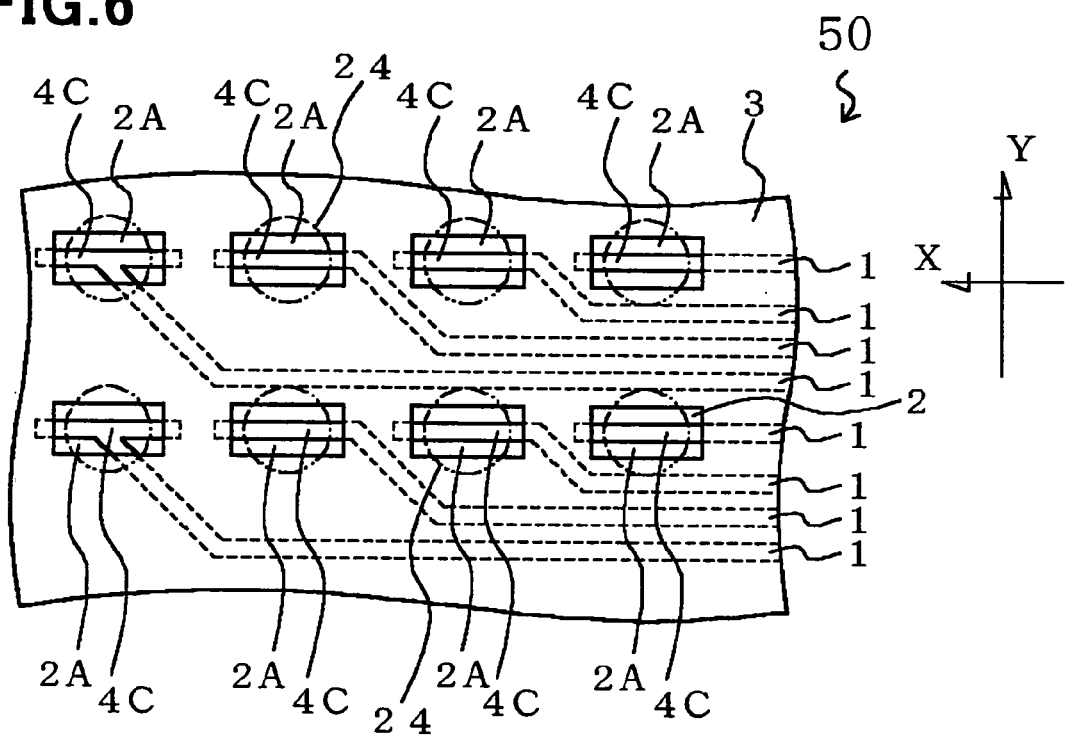
FIG. 6 is a partial plan view of the printed wiring board in accordance with the fifth embodiment of the present invention.

FIG. 6 is a partial plan view of a printed wiring board 50 in accordance with the fifth embodiment of the present invention. Parts or elements in FIG. 6 that correspond to those illustrated in FIG. 5 have been provided with the same reference numerals, and are not explained.

The fifth embodiment corresponds to a variation of a combination of the first and fourth embodiments.

In the printed wiring board 50 in accordance with the fifth embodiment, illustrated in FIG. 6, the pads 4C are arranged in four rows in the X direction, and the circuit wires 1 extend from the pads in a common direction (to the right in FIG. 6). Among the pads 4C in four rows, in the pad 4C located at the left end, the circuit wire 1 is connected to the pad 4C at a sidewall 4a of the pad 4C extending in the X direction, similarly to the fourth embodiment illustrated in FIG. 5. Among the pads 4C in four rows, in the rest of the pads 4C, the circuit wires 1 and the pads 4C extend in a common line.

Figure 7:
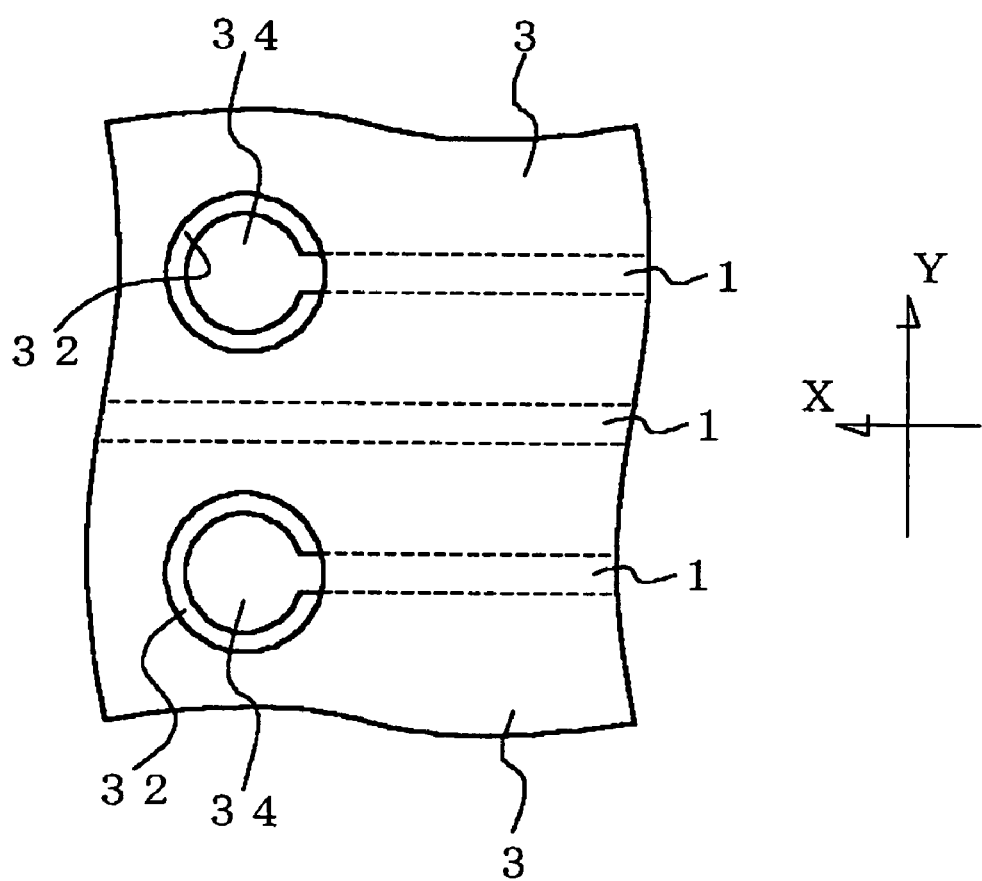
FIG. 7 is a partial plan view of an example of a conventional printed wiring board.

A dashed line around each of the pads 4C is an imaginary line 24 indicative of an outline of the conventional circular pad 34 (see FIG. 7).

When the circuit wire 1 extends from the conventional pad 34, the circuit wire 1 may intersect with the pad 34. For instance, when the circuit wire 1 extends from the pad 4C located in an upper row and at the left end, the circuit wire 1 intersects with the pads 34 (that is, the imaginary line 24) located in a lower row and at the second to fourth from the left end. When the circuit wire 1 extends from the pad 4C located in an upper row and at the second from the right end, the circuit wire 1 intersects with the pad 34 located in an upper row and at the right end.

Thus, the number of the circuit wires 1 which can be extended from the pads 34 in the conventional printed wiring board is smaller than the same in the fifth embodiment. As a result, it would be necessary for instance to arrange the circuit wires 1 in inner layers through via-holes, resulting in complexity of a structure of the printed wiring board. In the fifth embodiment, since the opening 2 of the electrical insulator 3 is designed to be rectangular, it would be possible to avoid complexity in a structure of the printed wiring board.

Hereinbelow, explanation is made with reference to an example.

If a pad is formed smaller in an area, a contact area between a pad and the electrical conductor 11 would be reduced accordingly. Hence, in order to enhance electrical characteristics, it is preferable that a length of the opening 2 in the X direction, which exerts an influence on an area of a pad, and a length of the circuit wire 1 are designed as long as possible, taking into consideration a gap between the distal ends 6 of the circuit wires 1 located adjacent to each other in the X direction.

For instance, in an area-array LSI package 13 having a pitch of 0.8 mm, a pad diameter is usually in the range of 0.35 mm to 0.45 mm both inclusive, and a gap between adjacent pads is in the range of 0.35 mm to 0.45 mm both inclusive.

When wires each having a width of 75 micrometers and spaced from one another at a pitch of 75 micrometers are arranged through the above-mentioned gap ranging from 0.35 mm to 0.45 mm, the number of the wires which can be arranged through the gap is 1 or 2. Thus, if three or more wires are arranged through the gap, it would be necessary to design a printed wiring board to have multi-layered structure, and to arrange wires in inner layers and extend the wires through via-holes.

When the rectangular pad 4C in the fifth embodiment is used, if the circuit wire has a width of 75 micrometers, the pad 4C would have a width of 75 micrometers, and hence, a gap between the adjacent pads 4C would be 0.725 mm. Thus, the number of the circuit wires 1 which can be extended through the gap is four, ensuring an increase in the number of layers in the printed wiring board in comparison with the conventional printed wiring board having the circular pads 34.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2002-143530 filed on May 17, 2002 including specification, claims, drawings and summary is incorporated herein by reference in its entirety.

What is claimed is:

1. A printed wiring board comprising:

a substrate;

an electrically conductive pattern formed on said substrate; and an electrical insulator covering said substrate and said electrically conductive pattern therewith, wherein a region of said electrically conductive pattern exposed through an opening formed throughout said electrical insulator is used as a pad used for electrically connecting said printed wiring board to a device to be mounted on said substrate, and a region except said pad is used as a circuit wire, said opening is formed so as to separately expose said electrically conductive pattern, said opening has opposite ends extending in a first direction beyond said electrically conductive pattern having a width equal to that of said circuit wire such that opposite ends of said pad in said first direction are defined by said electrically conductive pattern, said opening further has opposite ends extending in a second direction perpendicular to said first direction to intersect with said electrically conductive pattern such that said pad is defined in shape in said second direction by said opposite ends of said opening extending in said second direction, and said pad is smaller in length in said first direction than said circuit wire.

* * * * *